United States Patent [19]

Lamain et al.

[11] Patent Number: 5,399,910
[45] Date of Patent: Mar. 21, 1995

[54] HIGH VOLTAGE/CURRENT PULSE GENERATOR USING SPARK GAPS

[75] Inventors: Henri Lamain, Clamart; Jean-Max Buzzi, Antony, both of France

[73] Assignee: Centre National de la Recherche Scientifique, Paris, France

[21] Appl. No.: 847,986

[22] PCT Filed: Aug. 27, 1991

[86] PCT No.: PCT/FR91/00691
§ 371 Date: Apr. 28, 1992
§ 102(e) Date: Apr. 28, 1992

[87] PCT Pub. No.: WO92/03875
PCT Pub. Date: Mar. 5, 1992

[30] Foreign Application Priority Data

Aug. 28, 1990 [FR] France ................. 90 10718

[51] Int. Cl.⁶ .................................. H03K 3/53
[52] U.S. Cl. ....................... 307/106; 315/180; 315/181; 307/107
[58] Field of Search ................ 307/106, 107, 113, 125, 307/139, 140, 153, 157; 315/209 CD, 228, 237–238, 180–184; 330/53–55

[56] References Cited

U.S. PATENT DOCUMENTS

| | | | |
|---|---|---|---|
| 3,141,111 | 7/1964 | Godlove | 315/181 |
| 3,749,975 | 7/1973 | Walters | 315/241 R |
| 3,814,503 | 6/1974 | Milam | 350/160 R |

FOREIGN PATENT DOCUMENTS 2638304 4/1990 France .

OTHER PUBLICATIONS

English Abstract of Selected Articles from Soviet Bloc and Mainland China Series 5: Electronics and Electrical Engineering vol. 144, No. 21 Oct. 1962, Washington, U.S. pp. 41–42; A. I. Pavlovskiy et al.: 'Production of rectangular high voltage pulses' voir le document en entier.

IEEE Conference Record of the 1986 Seventeenth Power Modulator Symposium vol. 17, 1986, New York U.S. pp. 207–210; H. Krompholz et al.: 'Slow wave line-type pulsers' voir p. 207, colonne de gauche, ligne 9–ligne 15; FIG. 1.

*Primary Examiner*—Marc S. Hoff
*Assistant Examiner*—Aditya Krishnan
*Attorney, Agent, or Firm*—Oblon, Spivak, McClelland, Maier, & Neustadt

[57] ABSTRACT

A high voltage/high current electric pulse generator. Spark gap switches (E1, E2, E3) having a trigger electrode are connected to a trigger control circuit (CD). Switch (E1) is connected between the outer conductor of cable (C2) and an inner conductor of cable (C1). Switch (E2) is connected between the outer conductor of cable (C3) and the inner conductor of cable (C2). Switch (E3) is connected between output terminal (S) and the internal conductor of coaxial cable (C3). The outer conductor of cable (C1) is connected to ground and voltage source (SHT) is connected to internal conductors of the cables. The source charges cables (C1, C2, C3) in parallel when switches (E1, E2, E3) are off. A first ballast resistor (r) is connected between the first electrode and the trigger electrode. Load resistor (R6) is connected between the output terminal(S) and the external conductor of cable (C3). Resistor (R5) is connected between the outer conductor of cable (C3) and the outer conductor of cable (C2). Resistor (R4) is connected between the outer conductor of cable (C2) and ground. Resistor (R3) is connected between the inner conductor of cable (C3) and the inner conductor of cable (C2). Resistor (R2) is connected between the inner conductor of cable (C2) and the inner conductor of cable (C1). Resistor (R1) is connected between the inner conductor of cable (C1) and voltage source (SHT). Load resistors (R2, R3) are connected between the internal conductors of the coaxial cables.

3 Claims, 1 Drawing Sheet

HIGH VOLTAGE/CURRENT PULSE GENERATOR USING SPARK GAPS

BACKGROUND OF THE INVENTION

1. Field of the Invention

The present invention relates to a generator of very high voltage, and high current pulses.

2. Description of the Related Art

This invention is used in the supply of very high power klystrons and certain electron tubes, such as free electron lasers. This invention can also be used in the field of flash radiography or ionization. This invention can also constitute a polarization source in accelerators using collectors for recovering the energy of very intense electron beans (from a hundred to a few thousand amperes).

In such applications, the requisite pulses are very high voltage rectangular pulses (above 500 kV), supplied under an impedance of 500 to 3000 ohms and having the shortest possible rise time and the flattest possible amplitude plateau, with a duration of 100 nanoseconds to a few microseconds.

In existing generators, also known as modulators, use is generally made of a low impedance formation line constituted by discreet components (eapacitors and inductances). A high voltage thyratron controls the discharge of the line. The operating voltage of the thyratrons does not exceed 60 kV, so that a step-up transformer has to be used. As a result of the necessary electrical insulation associated by increasing the high voltage, said transformer necessarily has significant magnetic leaks, which limits the rise; time of the output pulse. At 500 kV, the rise time is roughly one microsecond, which can only increase with the output voltage.

FR-A-2 638 304 discloses high voltage, pulse generators comprising coaxial cables charged in parallel by a high voltage source and discharged in series across switches. If T is the transit time in a cable with n cables and the charging voltage V, a voltage having an amplitude of nV/2 for duration 2T is obtained.

Although satisfactory in certain respects, these related art generators suffer from disadvantages. For example, their voltage is limited to a few dozen kilovolts and are also limited in current. This is, on the one hand due to the use of switches of the transistor, thyristor (and similar types) and, on the other hand, to the use of resistors positioned between the output line and the earth or ground and which are exposed to the high voltage supplied.

SUMMARY OF THE INVENTION

The object of the present invention is to obviate these disadvantages by proposing a pulse generator able to operate at a very high voltage (several hundred kilovolts) and at a high current, i.e. at a very high power. To this end, the generator according to the invention provides for the use of spark gap switches and load and trigger resistors, which do not encounter see the very high voltage.

The invention specifically relates to an electric pulse generator in accordance with FR-A-2 638 304 and which is characterized in that the switches are spark gap switches having a first electrode connected to the internal conductor of a cable and a second electrode connected to the external conductor of the following cable and a trigger electrode connected to the trigger control circuit, two ballast resistors being provided between the first electrode and the trigger electrode and the second electrode and the trigger electrode and load resistors are provided between the external conductors of the coaxial cables and between the internal conductors of said coaxial cables.

BRIEF DESCRIPTION OF THE DRAWINGS

The invention is described in greater detail hereinafter relative to non-limitative embodiments and with reference to the attached drawings, wherein show:

DETAILED DESCRIPTION OF THE DRAWINGS

Figure 1:
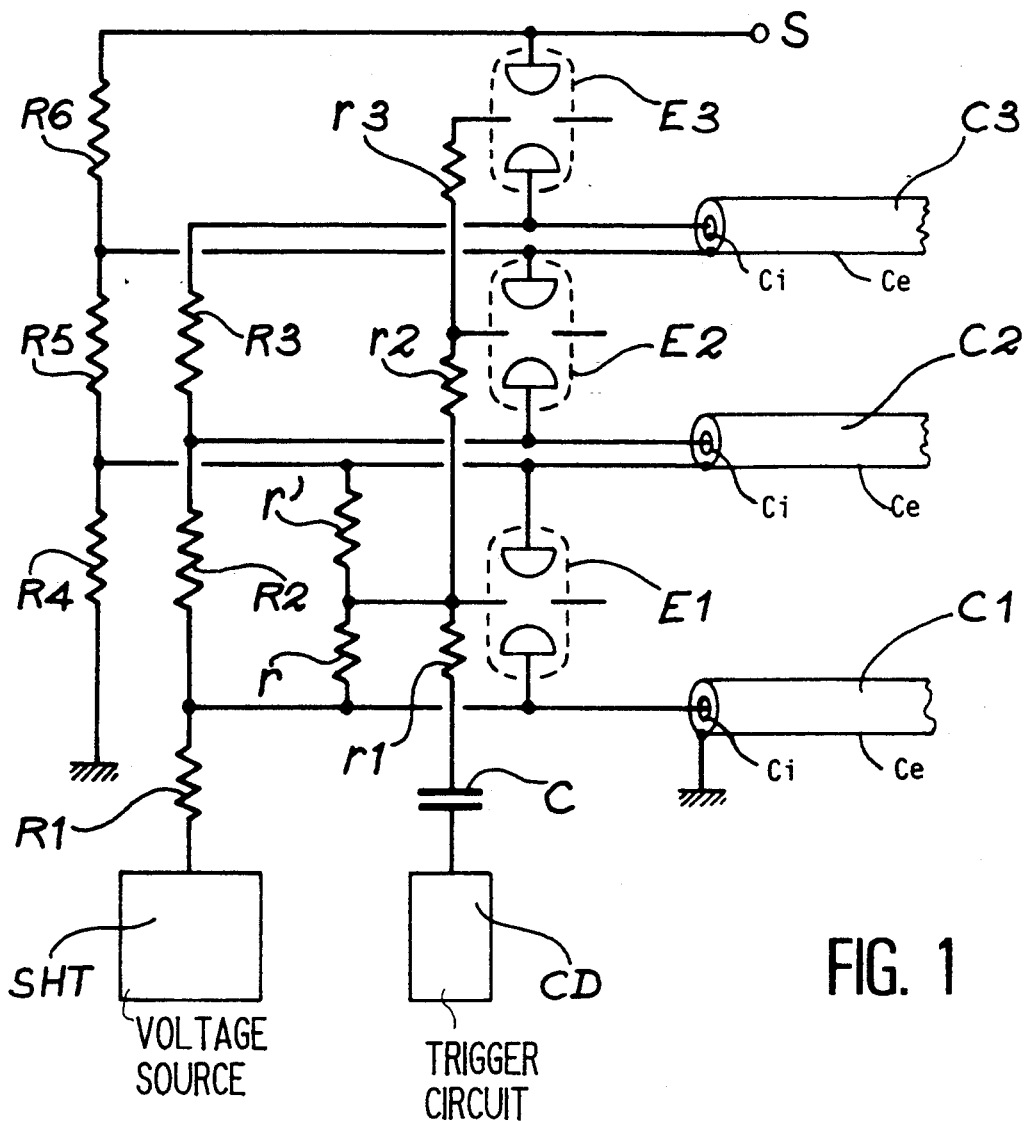

FIG. 1 A diagram of an embodiment of a generator according to the invention.

Figure 2:
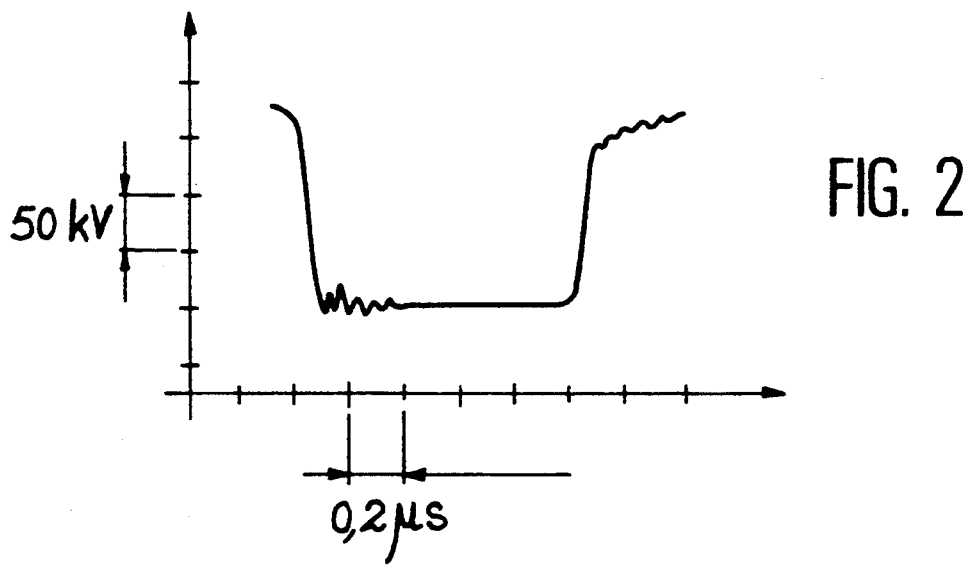

FIG. 2 An example of pulses obtained by the generator according to the invention.

FIG. 1 shows a generator having three commercially available coaxial cables C1, C2, C3, each having an external conductor Ce and an internal conductor Ci, three spark gap switches E1, E2, E3, a high voltage source SHT and a trigger circuit CD. The source SHT is connected to the cables by load resistors R1, R2, R3, R4, R5, R6. The resistors R4, R5 and R6 are positioned between the external conductors of the cables and the resistors R2, R3 between the internal conductors. The trigger circuit CD is connected to the trigger electrodes of the spark gap switches across a capacitor C and trigger resistors r1, r2, r3. Main supplementary resistors r, r' balance the voltages between the main electrodes of the spark gap switches and the trigger electrode. The main electrodes of the spark gap switches are connected, on the one hand, to the internal conductor Ci of a cable and on the other hand, to the external conductor Ce of the following cable.

The generator has a general output S connected to the external conductor of the final cable.

The operation of the device will now be discussed. The three cable C1, C2 and C3 are first charged in parallel by the high voltage source SHT. The control of the three spark gaps has the effect of connecting the three cables in series, which will be discharged and provide a voltage pulse on the general output S. A single line charged to a voltage U supplies, when it is discharged on a charge equal to its characteristic impedance Z, a pulse of amplitude U/2 and of duration equal to double the propagation t/me in said line. If T is the propagation time and N the number of cables, as a result of the generator according to the invention a pulse of duration 2T, amplitude NU/2 is obtained on a charge of impedance NZ (N is equal to 3 in the illustrated variant).

For example, if 3 100 m coaxial cables are used with an impedance of 50 ohms and charged to 50 kV, a pulse of $3 \times 25 = 75$ kV will be obtained lasting one microsecond on a charge of $3 \times 50 = 150$ ohms. For N=20, 500 kV are obtained on 1000 ohms.

The high voltage supply SHT can be a commercially purchased having a 130 kV, 5 mA supply. A trigger circuit should be chosen having a very short duration pulses of approximately 10 ns.

All the components can be submerged in an oil tank, which ensures the electrical response to the desired maximum voltage.

As the cables have a significant length (100 m or more), they can be wound onto a cylindrical support.

Each cable is wound with its resistors and spark gap switch. Thus, each stage has a modular character.

The operating frequency is limited by the heating due to the ohmic losses in the cables and spark gap switches, the dielectric losses in the cables and the oil, the convection movements induced in the oil by the voltages applied and by the power of the continuous source. The operating speed can also be limited when protection is not provided by ionizing rays being produced, if the charge is an electron gun.

FIG. 2 shows a pulse obtained by the generator of FIG. 1. The duration is close to one microsecond and the amplitude approximately 150 kV.

We claim:

1. High voltage, high current electric pulse generator comprising coaxial cables (C1, C2, C3) each having an external conductor and an internal conductor, switch (E3) connected between an output terminal (S) and the internal conductor of coaxial cable C3, switch (E2) connected between the outer conductor of cable (C3) and the inner conductor of cable (C2), switch (E1) connected between the outer conductor of cable (C2) and an inner conductor of cable (C1), the outer conductor of cable (C1) connected to ground a high voltage source (SHT) connected to all the internal conductors of the cables across resistors (R1, R2, R3, R4, R5, R6), said source charging all the cables (C1, C2, C3) in parallel when the switches (E1, E2, E3) are all off and a trigger control circuit (CD) connected to all the switches (E1, E2, E3) for turning the switches on and off wherein the switches are spark gap switches (E1, E2, E3) having a trigger electrode connected to the trigger control circuit (CD), a first ballast resistor (r) being connected between the first electrode and the trigger electrode and, wherein said load resistor (R6) is connected between the output terminal(S) and the external conductor of cable (C3), resistor (R5) is connected between the outer conductor of cable (C3) and the outer conductor of cable (C2), resistor (R4) is connected between the outer conductor of cable (C2) and ground, resistor (R3) connected between the inner conductor of cable (C3) and the inner conductor of cable (C2), resistor (R2) connected between the inner conductor of cable (C2) and the inner conductor of cable (C1), resistor (R1) connected between the inner conductor of cable (C1) and the voltage source (SHT).

2. High voltage/current electric pulse generator having a precharging period, when the generator charges, and a discharging period, when the generator outputs a high voltage/current pulse to an output terminal, comprising:

coaxial cables each having an inner and an outer conductor including a first cable, an intermediate cable and a last cable;

gap spark switches including a first switch, an intermediate switch and a last switch, wherein the first switch has a terminal connected to the inner conductor of said first cable and another terminal connected to the outer conductor of said intermediate cable, wherein the intermediate switch has a terminal connected to the inner conductor of said intermediate cable and another terminal connected to the outer conductor of said last cable, wherein the last switch has a terminal connected to said output terminal and another terminal connected to the inner conductor of said last cable;

a voltage source for precharging the coaxial cables during said precharging period;

a triggering circuit for switching the gap spark switches simultaneously to an on and an off position; and load resistors for precharging the coaxial cables during said precharging period and not allowing a leakage current through said load resistors during said discharging period, said load resistors including a first resistor having a terminal connected to the voltage source and another terminal connected to the inner conductor of said first cable, a second resistor having a terminal connected to the inner conductor of said first cable and another terminal connected to the inner conductor of said intermediate cable, a third resistor having a terminal connected between the inner conductor of said intermediate cable and the inner conductor of said last cable, a fourth resistor having a terminal connected to ground and another terminal connected to the outer conductor of said intermediate cable, a fifth resistor having a terminal connected to the outer conductor of said intermediate cable and another conductor connected to the outer conductor of said last cable, a sixth resistor having a terminal connected to the outer conductor of said last cable and another terminal connected to said output terminal.

3. The high voltage, high current pulse according to claim 2, further comprising:

a pair of first and second ballast resistors connected to a trigger electrode of the first switch said first ballast resistor having a terminal connected to the inner conductor of said first cable and another terminal connected to the trigger electrode of the first switch, said second ballast resistor having a terminal connected to the outer conductor of said intermediate cable and another terminal connected to the trigger electrode of the first switch.

* * * * *